(12) United States Patent
Babikian

(10) Patent No.: US 6,717,113 B2
(45) Date of Patent: Apr. 6, 2004

(54) METHOD FOR SUBSTRATE THERMAL MANAGEMENT

(75) Inventor: Dikran S. Babikian, Millbrae, CA (US)

(73) Assignee: ASML Holding N.V. (NL)

(*) Notice: Subject to any disclaimer, the term of this patent is extended or adjusted under 35 U.S.C. 154(b) by 0 days.

(21) Appl. No.: 10/188,546

(22) Filed: Jul. 2, 2002

(65) Prior Publication Data

US 2002/0195438 A1 Dec. 26, 2002

Related U.S. Application Data

(63) Continuation of application No. 09/520,077, filed on Mar. 7, 2000, now Pat. No. 6,414,276.

(51) Int. Cl.$^7$ ................................................. F27B 5/14
(52) U.S. Cl. .................. 219/390; 219/405; 219/411; 219/443.1; 219/536; 219/540; 219/542; 219/444.1; 392/416; 392/418; 118/724; 118/725; 118/50.1
(58) Field of Search ................................. 219/390, 400, 219/399, 405, 411, 443.1, 444.1, 536, 540, 542, 543, 544; 392/416, 418; 118/724, 725, 728, 50.1

(56) References Cited

U.S. PATENT DOCUMENTS

| | | | |
|---|---|---|---|
| 3,783,822 A | 1/1974 | Wollam | 118/49.1 |
| 4,518,848 A | 5/1985 | Weber | 219/388 |
| 5,001,423 A | 3/1991 | Abrami et al. | 324/760 |
| 5,025,133 A | 6/1991 | Tsuthara et al. | 219/444.1 |
| 5,034,688 A | 7/1991 | Moulene et al. | 324/760 |
| 5,151,871 A | 9/1992 | Matsumura et al. | 700/300 |
| 5,252,807 A | 10/1993 | Chizinsky | 219/390 |
| 5,452,177 A | 9/1995 | Frutiger | 361/234 |
| 5,517,594 A | 5/1996 | Shah et al. | 392/416 |
| 5,538,758 A | 7/1996 | Beach et al. | 427/255.6 |
| 5,595,241 A | 1/1997 | Jelinek | 165/80.1 |
| 5,624,590 A | 4/1997 | Flory | 219/390 |
| 5,686,779 A | 11/1997 | Vig | 310/366 |
| 5,715,361 A | 2/1998 | Moslehi | 392/416 |
| 5,730,803 A | 3/1998 | Steger et al. | 118/723 |
| 5,775,416 A | 7/1998 | Heimanson et al. | 165/275 |
| 5,811,762 A | 9/1998 | Tseng | 219/385 |
| 5,851,298 A | 12/1998 | Ishii | 118/728 |
| 5,855,675 A | 1/1999 | Doering et al. | 118/719 |
| 5,948,283 A | 9/1999 | Grosshart | 216/67 |
| 5,954,982 A | 9/1999 | Sogard | 219/502 |

(List continued on next page.)

FOREIGN PATENT DOCUMENTS

| | | |
|---|---|---|
| WO | WO 98/05060 | 2/1998 |
| WO | WO 99/18602 | 4/1999 |
| WO | WO 99/45745 | 9/1999 |

*Primary Examiner*—Shawntina Fuqua
(74) *Attorney, Agent, or Firm*—Blakely, Sokoloff, Taylor & Zafman LLP

(57) ABSTRACT

This invention is a thermal management method for efficient, rapid, controllable and uniform thermal management over a wide temperature range. The method integrates a thermal source, thermal sink and a thermal diffuser. According to the invention, a thermal diffuser is positioned stationary relative to the wafer surface and coupled to a thermal source and a thermal sink, which are also stationary relative to the wafer surface. The thermal sink comprises a heat-carrying media with a controllable temperature. The wafer is heated from a first processing temperature to a second processing temperature during a heating time interval and then cooled to the first processing temperature from the second processing temperature during a cooling time interval. During heating and cooling, the wafer is constantly held in a fixed position. Zonal control of the thermal source and non-uniform flow of the thermal sink enable sensitive mitigation of thermal non-uniformity on a heating surface.

17 Claims, 8 Drawing Sheets

U.S. PATENT DOCUMENTS

| | | | |
|---|---|---|---|
| 5,981,913 A | 11/1999 | Kadomura et al. | 219/444.1 |
| 6,046,439 A | 4/2000 | Johnsgard et al. | 219/444.1 |
| 6,072,163 A | 6/2000 | Armstrong et al. | 219/497 |
| 6,080,969 A | 6/2000 | Goto et al. | 219/444.1 |
| 6,091,060 A | 7/2000 | Getchel et al. | 219/483 |
| 6,097,005 A | 8/2000 | Akimoto | 219/444.1 |
| 6,107,608 A | 8/2000 | Hayes | 219/444.1 |
| 6,107,609 A | 8/2000 | Strodtbeck et al. | 219/446.1 |
| RE36,957 E | 11/2000 | Brors et al. | 118/725 |
| 6,270,580 B2 | 8/2001 | Vu et al. | 118/666 |
| 6,359,264 B1 * | 3/2002 | Schaper et al. | 219/444.1 |
| 6,472,643 B1 | 10/2002 | Babikian | 219/444.1 |

* cited by examiner

METHOD FOR SUBSTRATE THERMAL MANAGEMENT

This is a continuation of application Ser. No. 09/520,077, filed Mar. 7, 2000, now U.S. Pat. No. 6,414,276.

BACKGROUND OF THE INVENTION

1. Field of the Invention

This invention relates in general to the field of wafer processing and to rapid, uniform heating and cooling of semiconductor wafers during integrated circuit manufacturing in particular.

2. Discussion of Related Art

Temperature uniformity across a wafer surface is an important factor in many integrated circuit fabrication steps since rate processes used in fabrication are generally temperature dependent. In particular processes, thermal non-uniformity can adversely effect a circuit element's critical dimension size by enlarging it relative to a design goal. Thus, as trends toward smaller integrated circuit critical dimensions continue, temperature uniformity requirements for wafer thermal management systems will become increasingly stringent.

For example, as compared to earlier standards, current temperature uniformity requirements of 0.1° C. across a several hundred millimeters diameter wafer represent a 50% increase in temperature uniformity. Wafer heating and cooling units must be able to achieve such temperature uniformity figures of merit over a wide range of process operating temperatures, typically from about 20° C. to several hundred degrees Celsius, and in a manner consistent from wafer-to-wafer. Rapid thermal management over the operating temperature range is also desirable for economy of process.

In the wafer processing art, stringent requirements for efficient, rapid, controllable and uniform thermal management over a wide temperature range are not fully met in an integrated device. In examples of closely related art, separate devices carry out heating and cooling functions, but as a mere combination of separate heating and cooling units positioned in opposition to each other. In these devices, a wafer is interposed between the heating and cooling elements and is translated between the elements.

An example of such a device is shown in FIG. 1. In FIG. 1, semiconductor wafer 110, heating surface 120, and cooling surface 130 are shown. A hot thermal source and a cold thermal sink interacting with the wafer are not integrated. Rather, they are physically separated or otherwise thermally isolated from each other. To heat or cool the semiconductor wafer, the wafer is mechanically translated in a space between the heating and cooling surfaces according to the desired function. This is inefficient for the manufacturing process flow and clean-room floor space utilization, as compared to an integrated thermal management device that performs both heating and cooling functions.

Thus, due to the limitations of related art, there is a need for methods of efficient, rapid, controllable and uniform thermal management over a wide temperature range. Further, there is a need for an apparatus that provides the desired high performance during both steady state and transient conditions and that is very suitable for easy use within a manufacturing setting.

SUMMARY OF THE INVENTION

This invention is a method of substrate thermal management for efficient, rapid, controllable and uniform thermal management over a wide temperature range.

One object of the thermal management method is to integrate a thermal source, thermal sink and a thermal diffuser. According to the invention, a thermal diffuser is positioned stationary relative to the wafer surface and coupled to a thermal source and a thermal sink, which are also stationary relative to the wafer surface. The thermal sink comprises a heat-carrying media with a controllable temperature. The wafer is heated from a first processing temperature to a second processing temperature during a heating time interval and then cooled to the first processing temperature from the second processing temperature during a cooling time interval. During this process, the wafer is constantly held in a fixed position.

Another object of the thermal management method is to minimize thermal non-uniformity across a wafer surface by diffusing heat from the heating elements through a thermal diffuser made of thermally conductive material to a heating surface facing the wafer, thereby smoothing temperature gradients of the thermal source.

Yet another object of the thermal management method is to minimize thermal non-uniformity across a wafer surface by non-uniform control of zones in a thermal source. According to the invention, a thermal source includes a plurality of zones adapted to provide differing amounts of heat and a controllable temperature field over a surface proximal to a thermal diffuser. The thermal diffuser is diffuses thermal gradients and is positioned stationary relative to the wafer surface and coupled to a thermal source and a thermal sink, which are also stationary relative to the wafer surface. The wafer is cooled by a thermal sink comprises a heat-carrying media with a controllable temperature.

Yet another object of the thermal management method is to minimize thermal non-uniformity across a wafer surface by flowing a thermal sink material of controllable temperature through passages of a thermal reservoir in a non-uniform manner. According to the invention, such a non-uniform flow may establish a controllable, distributed and substantially uniform thermal sink temperature field.

DETAILED DESCRIPTION

In contrast to other teachings, this invention integrates a thermal source and a thermal sink in a substrate thermal management system. Integrating heating and cooling units interacting with a substrate has attendant advantages over a mere combination of a thermal source and a thermal sink, enabling efficient, rapid, controllable and uniform thermal management over a wide temperature range. This desired high performance is achieved during both steady state and transient conditions and the system apparatus is very suitable for easy use within a manufacturing setting.

Figure 1:
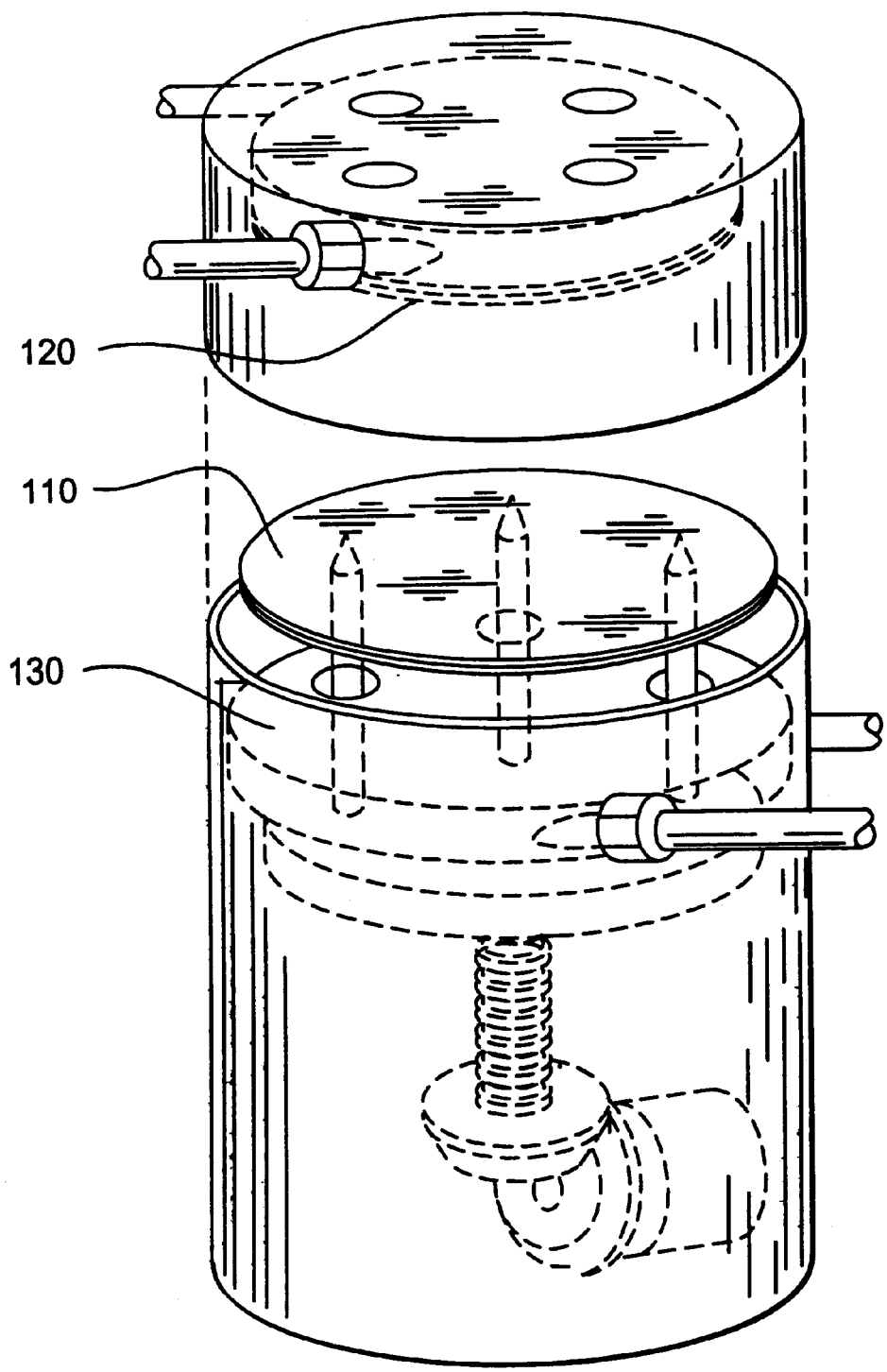
FIG. 1 is a drawing showing an exemplary prior art device.
Figure 2:
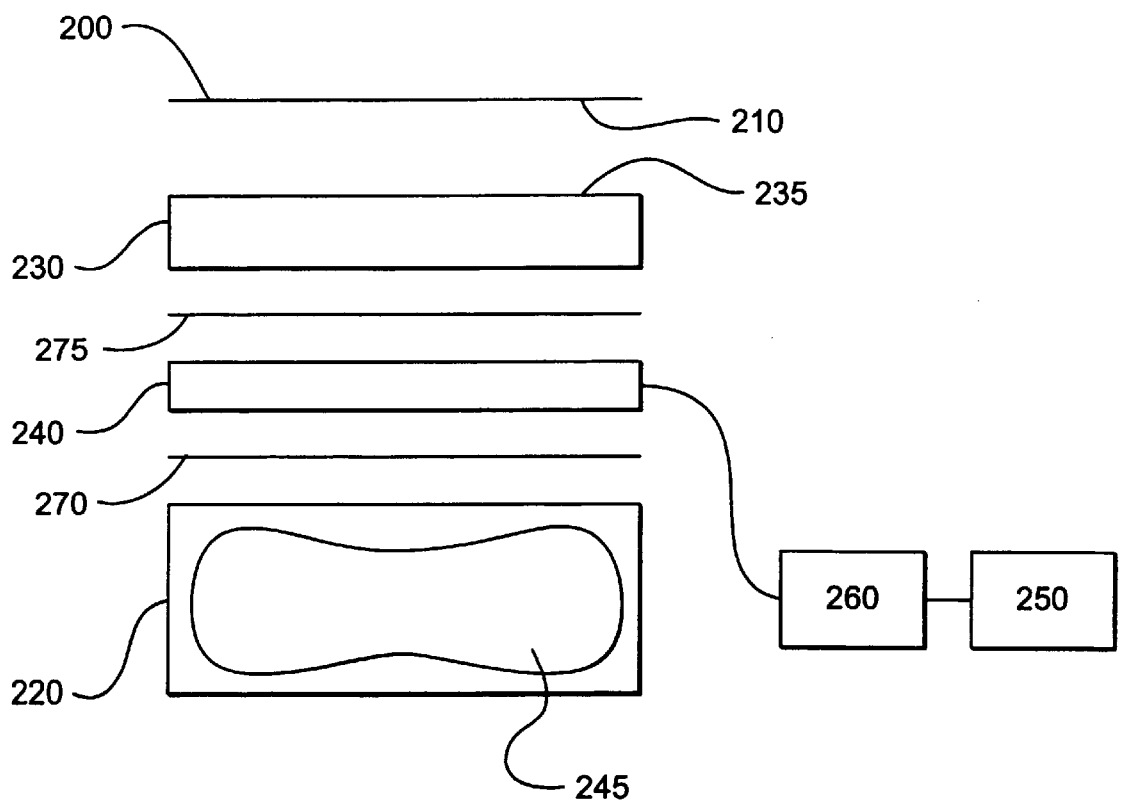
FIG. 2 is an exploded view showing one embodiment of the invention assembly.

FIG. 2 is an exploded view showing an assembly according to one embodiment of this invention. The assembly may be an element of a system further comprising a plurality of devices such as the one illustrated in FIG. 2 or a sub-atmospheric enclosure or a super-atmospheric enclosure. Typical embodiments, however, are adapted to operate at room conditions.

In FIG. 2, wafer 200, wafer surface 210, thermal reservoir 220, thermal diffuser 230, heating surface 235, thermal source 240, thermal sink 245, power supply 250, controller 260 and optional thermal insulators 270 and 275 are shown. A preferred embodiment includes a thermal diffuser made of a material with an isotropic thermal conductivity, such as Cu or Al, and a thermal insulator 270 substantially made of Kapton.™ Alternative embodiments include a thermal diffuser made of a material with a non-isotropic thermal conductivity. Typically, the thermal diffuser thickness perpendicular to the wafer surface is less than about 0.100 inch.

In FIG. 2, the wafer is heated across a gap between wafer surface 210 and heating surface 235. The gap is typically a few hundred micrometers wide and filled with a gas such as room air, or nitrogen, or helium, or other gasses with desirable physical properties. Alternate embodiments have different gap widths and gases with comparatively greater thermal conductivity than air. Thermal reservoir 220, thermal diffuser 230, thermal source 240, and thermal sink 245 have associated thermal masses, $M_r$, $M_d$, $M_s$, and $M_{sk}$, respectively. The heating surface and a surface of the thermal source proximal to the thermal diffuser have associated temperature fields, $T_d$ and $T_s$, respectively. The thermal source, thermal reservoir and thermal diffuser are integrated and in inseparable communication by thermal conduction. Typically, thermal sink 245 is a volume of flowing fluid material with controllable temperature, which may be a constant temperature. Thus, the thermal sink and the thermal reservoir are typically in inseparable communication by conduction and convection heat transfer. Other embodiments of the thermal sink are not limited to a flowing fluid, such as a stationary fluid or a solid.

In FIG. 2, thermal sink 245 determines the lower temperature bound of the thermal management system. The thermal mass of the thermal sink, $M_{sk}$, may be significantly greater than the thermal masses of the other elements. In different embodiments, $M_{sk}$ is at least 10, or at least $10^2$, or at least $10^3$, or at least $10^4$ times greater than $M_d$. In a preferred embodiment, the thermal sink is a constant temperature thermal sink provided by a chilled water supply in a factory. By virtue of continuous coupling of the comparatively large thermal mass of the thermal sink to thermal reservoir 220, the thermal reservoir may be a substantially constant and substantially uniform temperature thermal reservoir. Particular embodiments of the thermal reservoir may include features to further enhance temperature uniformity, infra.

Figure 3:
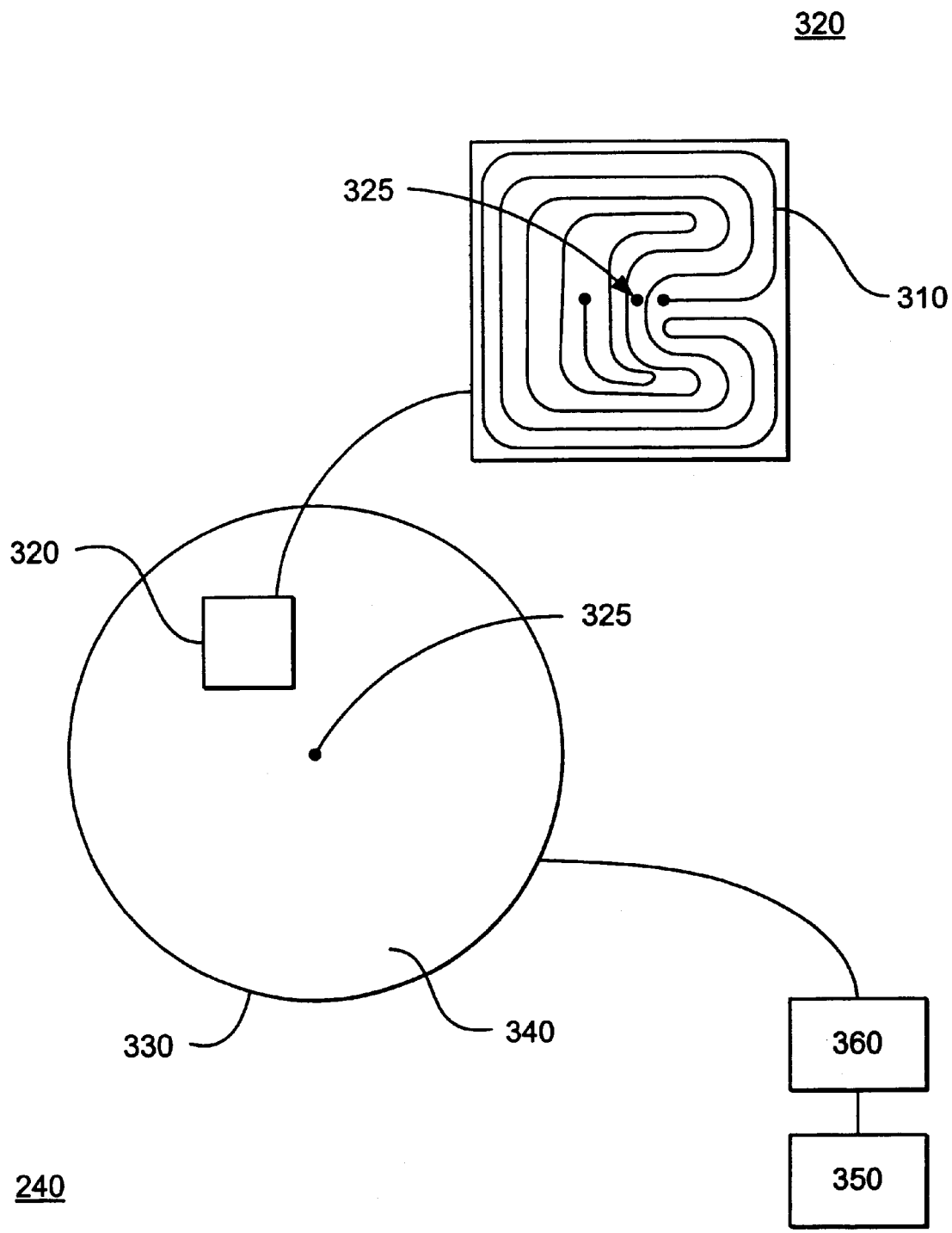
FIG. 3 is a sketch illustrating one embodiment of a thermal source used with the apparatus shown in FIG. 2.

FIG. 3 is a sketch illustrating a particular embodiment of thermal source 240. In FIG. 3, heating element 310, heating zone 320, temperature sensor 325, covering material 330, thermal source surface 340, power supply 350 and controller 360 are shown. As illustrated in FIG. 2, thermal source 240 is coupled to thermal reservoir 220 and thermal diffuser 230. Particular embodiments of the thermal source may require continuous thermal coupling to the thermal reservoir and thermal sink during operation to avoid overheating the thermal source. Covering material 330 is typically an electrical insulator. Particular embodiments include a thermally resistive covering material such as Kapton.™ In a preferred embodiment, the thermal coupling of the source and the thermal reservoir is inseparable.

Typically, thermal source 240 is an electrical resistance heater with a relatively small thermal mass, $M_s$, as compared to the thermal masses of other components shown in FIG. 2. In different embodiments, the ratio ($M_s/M_d$) is less than about $10^{-1}$, or less than about $10_{-2}$, or less than about $10^{-3}$, or less than about $10^{-4}$. Particular embodiments of the thermal source are heaters with sub-millimeter sized metallic electrical resistance heating elements 310 contained in at least one heater zone 320 to produce a surface temperature field $T_s$, on thermal source surface 340. An example of such a resistance heater is a Thermofoil™ heater from Minco Products, Inc., Minneapolis, Minn. Typically, the thermal source is rated at less than 100 W/in² and may include a polymer covering material. The thickness of the thermal source in a direction perpendicular to wafer 200 (see FIG. 2) is generally less than 0.05 in. The thermal mass of the thermal source is typically less than about one tenth of the thermal mass of the thermal diffuser.

The particular form and distribution of heating elements 310 within heater zones 320, and the number and placement of independently controllable heating zones, enables controller 360 to adjust the surface temperature field, $T_s$, on a surface of thermal source 240. Further, controlling amounts of power delivered to electrical resistance heating elements in the thermal source provides a controllable energy flux which may be smoothly variable over an interface between covering material 330 and another element to which the thermal source is coupled (see FIG. 2). Feedback control of $T_s$ is accomplished by use of at least one temperature sensor 325 embedded in the thermal source. Particular embodiments may a equal numbers of sensors and zones. A typical embodiment can control $T_s$ to be uniform to within less than 1° C. Alternate embodiments may have a controllably non-uniform $T_s$. Generally, there is a temperature difference of about 200–300° C. between the thermal source and the thermal sink, although this figure is not a limitation.

As shown in FIG. 2, thermal source 240 is coupled to thermal diffuser 230, which faces wafer 200. In a preferred embodiment, the thermal source and diffuser are in direct contact. The thermal diffuser acts passively, reducing the magnitudes of gradients in $T_s$ as heat passes through the diffuser to provide heating surface 235 with a substantially uniform temperature field. Gradients in $T_s$ arise from the length scales inherent to the structure of the thermal source 240 and can lead to non-uniform heating of the wafer. The substantially uniform temperature field $T_d$ over the heating surface then acts to heat wafer surface 210 across a very narrow gap of typically a few hundred micrometers.

Figure 4:
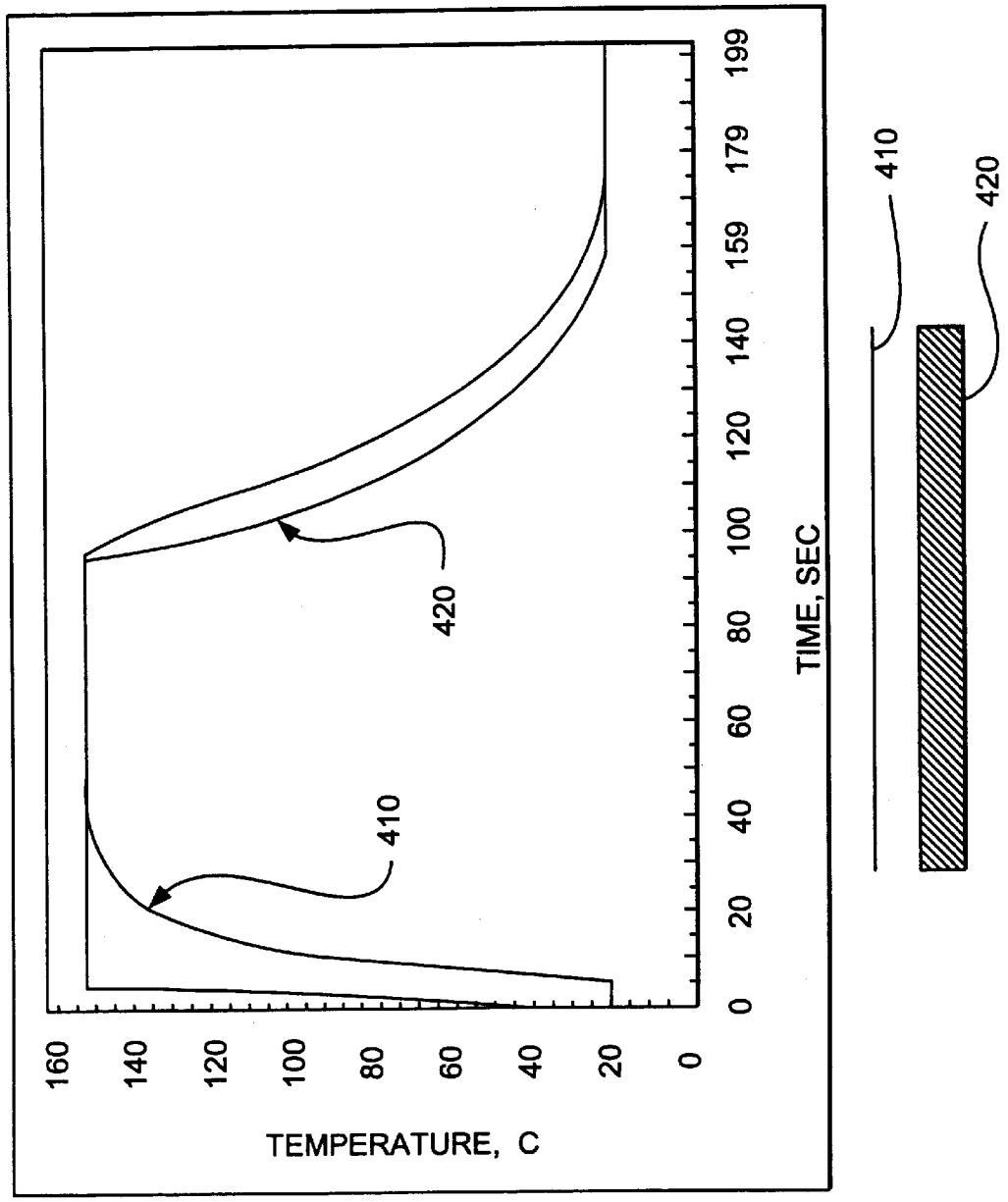
FIG. 4 is a graph illustrating thermal time response for a particular embodiment of the invention.

FIG. 4 is a graph illustrating thermal time response curves for one embodiment of the invention. Both a wafer temperature 410 and a temperature of the heating surface 235 (see FIG. 2) are shown. The embodiment comprises a thermal sink at a constant temperature of 8° C.; a thermal source providing an energy flux of 45 W/in², and a 0.060 inch thick aluminum thermal diffuser. An air gap of 0.006 inch is between the thermal diffuser and the wafer. In general, preferred embodiments span a design temperature range for heating or cooling the wafer in a time interval no more than about 60 s. Typically, thermal speeds are greater than 0.5° C./s. In FIG. 4, the wafer is heated from room temperature to 150° C. in less than 60 s and cooled from 150° C. to room temperature in approximately 60 s. In typical embodiments, a cooling time is comparable to a heating time over the same temperature range to within about 25%.

Figure 5:
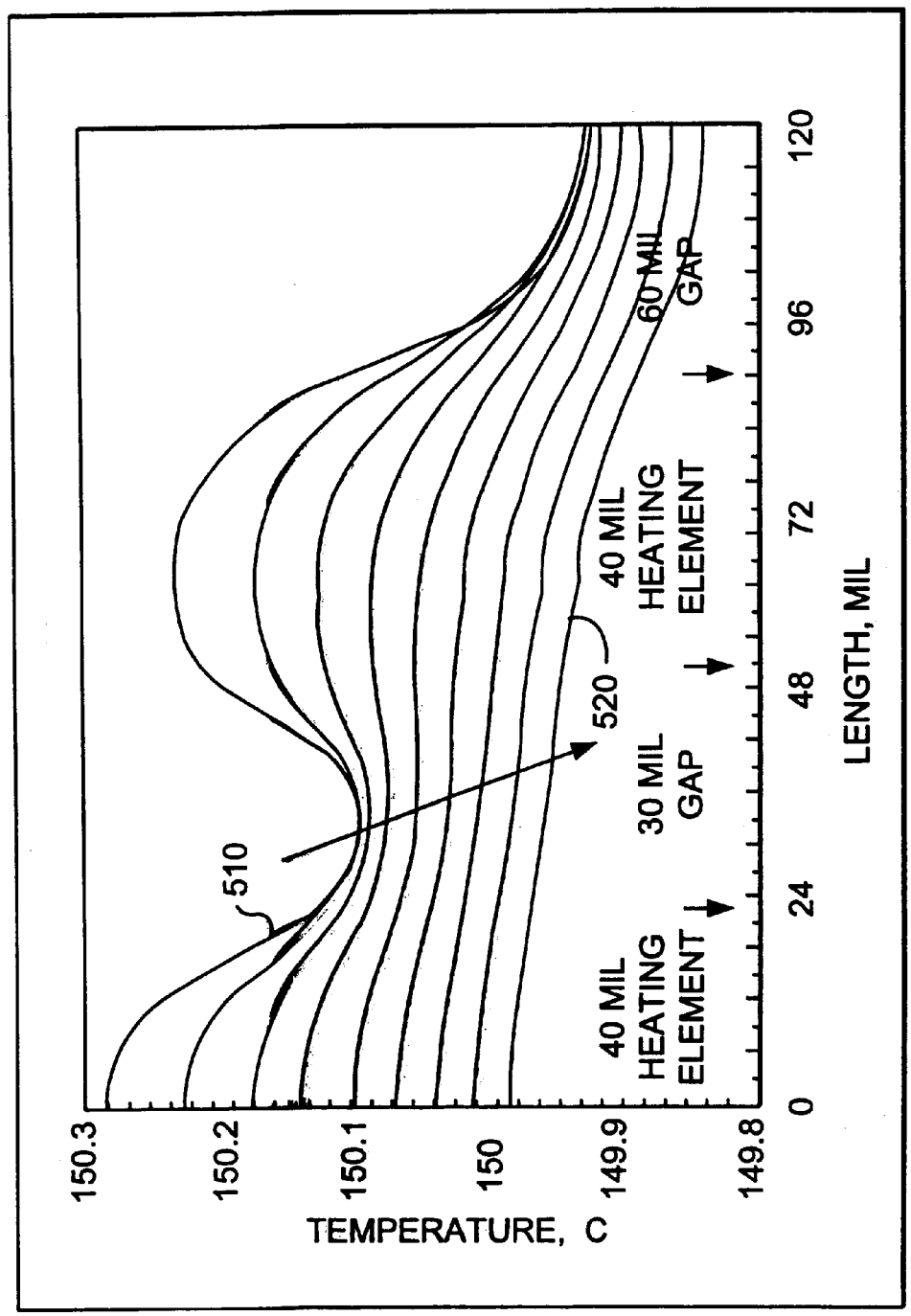
FIG. 5 is a graph illustrating the smoothing of temperature gradients by the thermal diffuser.

FIG. 5 is a graph illustrating the smoothing of temperature gradients by thermal diffuser 230 (see FIG. 2) for one embodiment of the invention. FIG. 5 contains a family of temperature profiles. The temperature profiles are along a radius of a circular thermal diffuser for various depths within the thermal diffuser material. Profiles proximal and distal to thermal source 240 are indicated as 510 and 520, respectively. In this embodiment, the thermal source comprised electrical resistance strips 0.040 inch wide and spaced apart by 0.030 inch-0.060 inch. The thermal diffuser was 0.040 inch thick Al. An air gap of 0.006 inch was between the thermal diffuser and the wafer. As shown in FIG. 5, the temperature profile at the heating surface 235 is uniform to within about 0.15° C.

Figure 6:
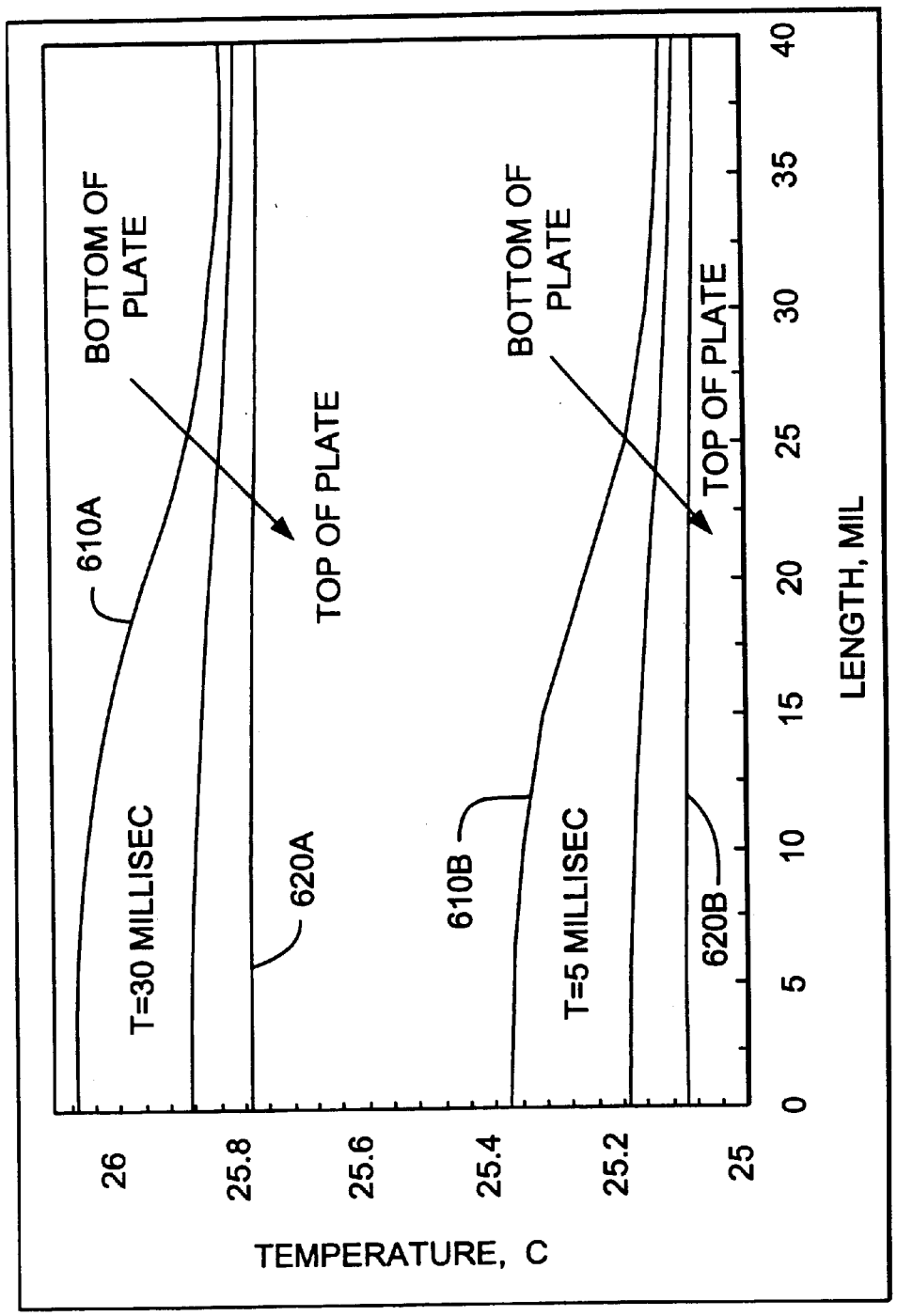
FIG. 6 is a graph illustrating the smoothing of temperature gradients by the thermal diffuser over a time interval during transient operation.

FIG. 6 is a graph illustrating the smoothing of temperature gradients by thermal diffuser 230 (see FIG. 2) for one embodiment of the invention over a time interval during transient operation. FIG. 6 contains a family of temperature profiles. The temperature profiles are along a radius of a circular thermal diffuser for various depths within the thermal diffuser material over a 25 ms time interval. Profiles proximal and distal to thermal source 240 are indicated as 610 and 620, respectively. Thus, the profile distal to the thermal source in FIG. 6 is the temperature profile on heating surface 235 (see FIG. 2). In the embodiment for FIG. 6, the thermal source comprised electrical resistance strips 0.020 inch wide and spaced apart by 0.020 inch. The thermal diffuser was 0.040 inch thick Al. An air gap of 0.006 inch is between the thermal diffuser and the wafer. As shown in FIG. 6, the temperature profile 620 at heating surface 235 is highly uniform over the transient time interval.

Figure 7A:
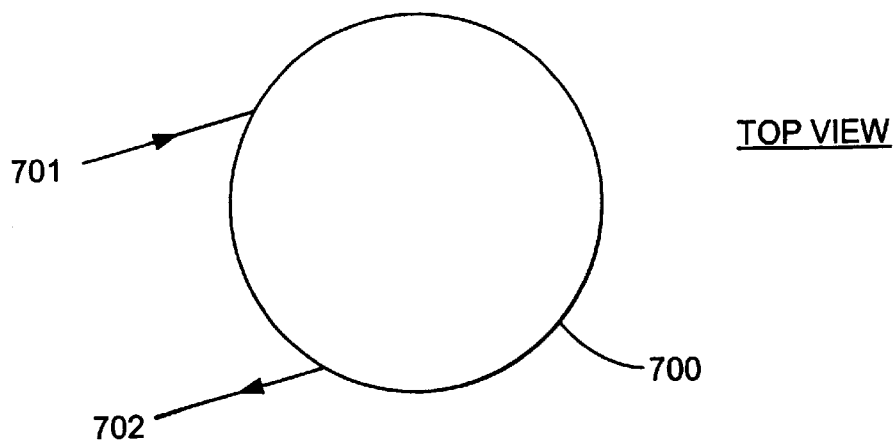
FIGS. 7A–7F are sketches illustrating aspects of the invention suited to provide a uniform temperature field in the thermal reservoir by employing convection heat transfer.

FIGS. 7A–7D are sketches illustrating particular aspects of the invention suited to providing a uniform temperature field at a thermal reservoir-heat source interface (see FIG. 2) by employing convection heat transfer. Typically, the thermal sink is a flowing single-phase fluid, such as liquid water. Alternate embodiments may have a stationary solid thermal sink or gaseous thermal sink. Typically, the thermal sink is at a temperature greater than about 40° C. FIG. 7A shows a top view schematic of a device from a field of related art. In FIG. 7A, thermal reservoir 700, fluid inlet 701 and fluid outlet 702 are shown. Fluid enters inlet 701 and exits at outlet 702 with different fluid elements experiencing differing residence times within the thermal reservoir. The differing residence times can lead to small temperature gradients in the fluid within the thermal reservoir due to the fluid's finite heat conductivity. Temperature gradients in the fluid may lead to undesirable temperature gradients on thermal reservoir surfaces.

According to this invention, the internal structure of the thermal reservoir equalizes residence times of fluid elements within it. Further, the thermal reservoir structure is designed to accelerate an internal fluid flow field to achieve a substantially uniform fluid temperature within the thermal reservoir and a corresponding substantially uniform temperature field on a thermal reservoir surface facing the rest of the thermal management apparatus (see FIG. 2).

A uniform temperature fluid is provided by variation of a fluid mass flow rate and fluid velocity through the thermal reservoir. The interior structure of the thermal reservoir varies the fluid velocity in a manner that establishes a uniform net heat flux into a fluid element, resulting in a uniform fluid temperature. In the above, the net heat flux consists of contributions due to conduction and convention. With a uniform temperature fluid within the thermal reservoir, a substantially uniform temperature field results on a thermal reservoir surface facing the rest of the thermal management apparatus.

Figure 7B:
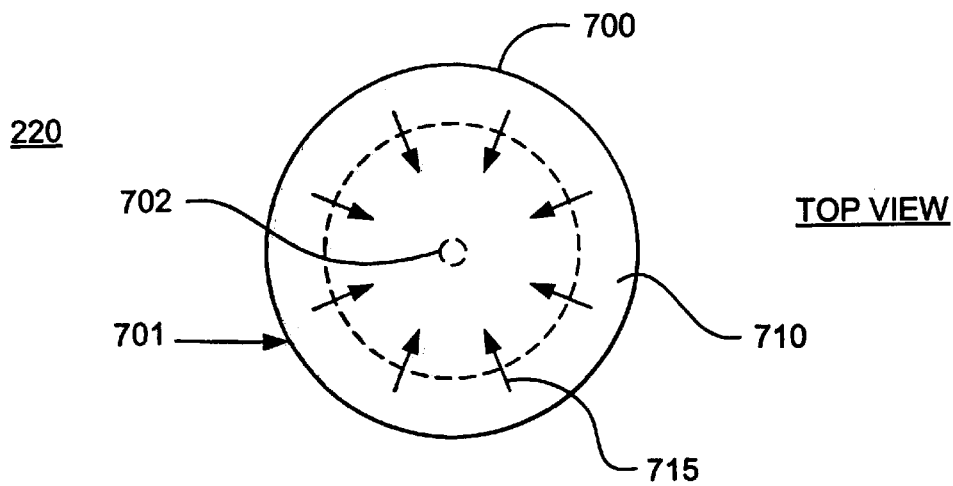

FIG. 7B is a sketch of a top view of one embodiment. Thermal reservoir 220, orifices 715, inlet 701, outlet 702 and plenum 710 are shown. Fluid enters the inlet to the plenum. A fluid flow from the plenum to the outlet is driven by a pressure gradient between the plenum and the outlet. The symmetry of the flow allows each fluid element to reside in the flow field for substantially the same time.

Figure 7C:
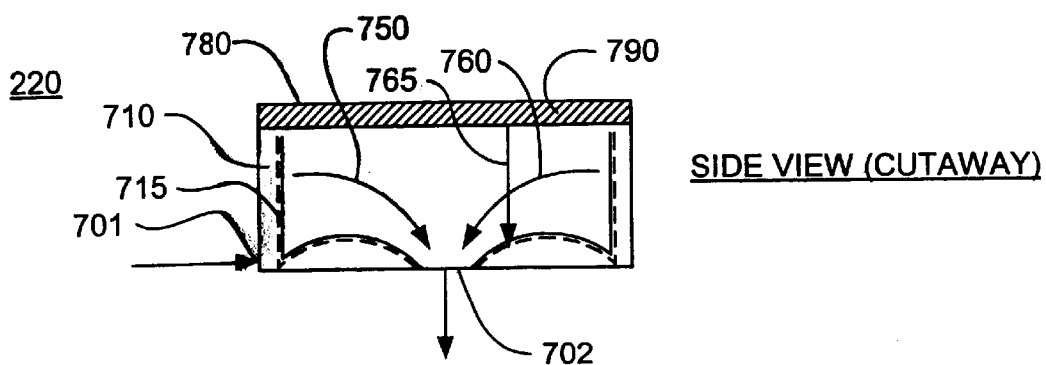

FIG. 7C is a sketch showing a cross-sectional view of the embodiment in FIG. 7B. FIG. 7C illustrates aspects of the thermal reservoir's structure that enable an acceleration of the internal fluid flow field to achieve a substantially uniform fluid temperature within the thermal reservoir. In FIG. 7C, inlet 701, outlet 702 plenum 710, orifice 715, exemplary streamlines 750 and 760, cross sectional area 765, interface surface 790, and optional second thermal diffuser 780 are shown. In FIG. 7C, fluid enters the inlet to the plenum, where it resides until passing through an orifice and to flow along exemplary streamlines to the outlet.

If a fluid acting as thermal sink 245 within thermal reservoir 220 is at rest, the temperature of the fluid will tend to rise under the action of heat flux across interface surface 790 since a temperature gradient driving the conduction is reduced. Likewise, when a fluid element moves through the thermal reservoir as in FIG. 7A, any rise in the temperature of the fluid element during its residence time in the thermal reservoir will tend to decrease the flux of heat to it from the surroundings due to conduction. Thus, for a uniform heat flux input to the thermal reservoir, a non-uniform conduction heat flux to the fluid arises.

The magnitude of convection heat transfer depends on flow velocity as well as a temperature gradient. If the velocity of a fluid flow in the thermal reservoir is uniform, heat flux due to convection will scale in a manner similar to heat flux due to conduction. However, if the flow velocity is varied within the thermal reservoir, heat flux due to convection can be non-uniform. Acting in combination, then, a non-uniform conduction heat flux and a non-uniform convection heat flux may result in a uniform temperature fluid.

According to this invention, a variation in cross-section area 765 causes a variation in fluid velocity in the thermal reservoir. Variation of flow channel cross-section area is well understood to accelerate or decelerate fluid flows. Since the fluid velocity in non-uniform within the thermal reservoir, the net heat flux to the fluid may result in a uniform fluid temperature. With the fluid within the thermal reservoir having a uniform temperature, the temperature field at an interface surface 790 may also be substantially uniform. An optional second thermal diffuser 780 with characteristics similar to thermal diffuser 230 (see FIG. 2) may also be coupled in proximity to the thermal reservoir, acting to further reduce any residual temperature non-uniformity.

Figure 7D:
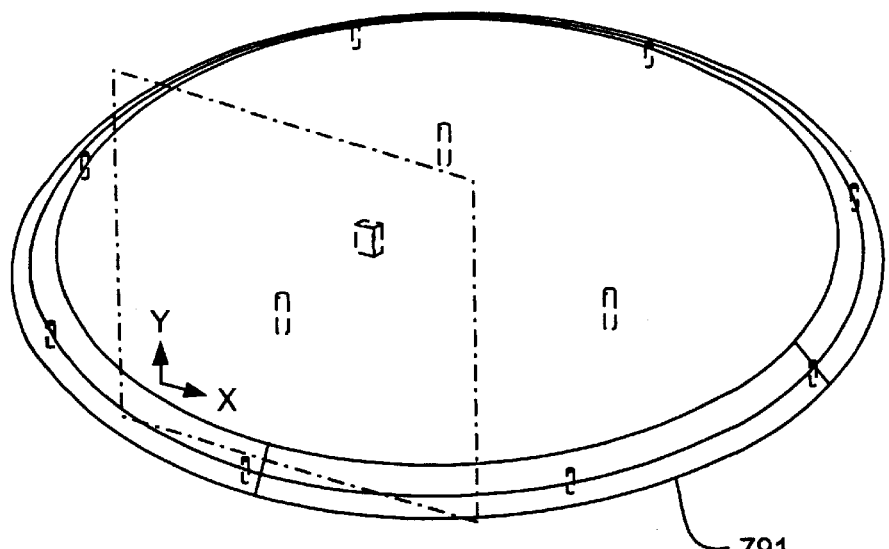
Figure 7E:
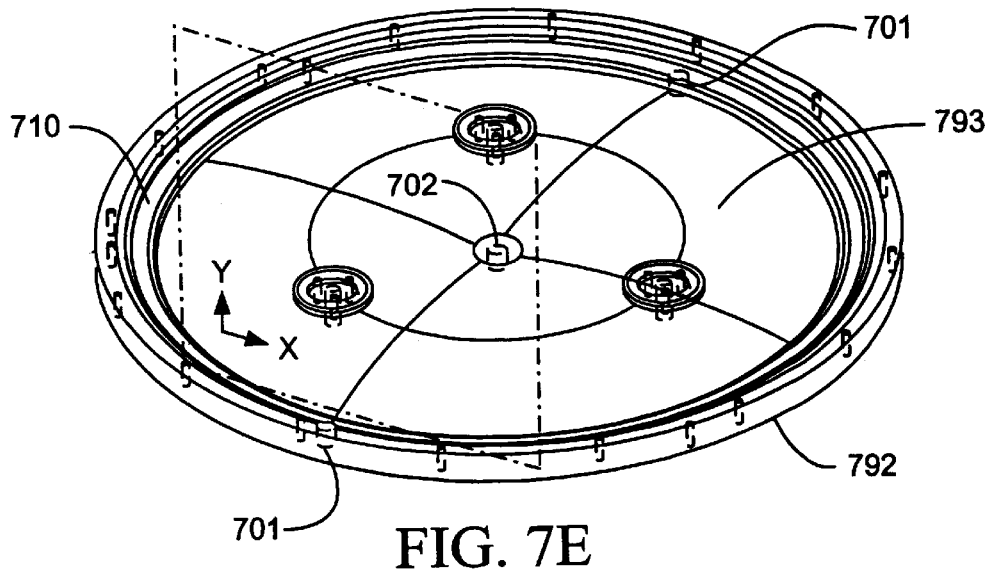
Figure 7F:
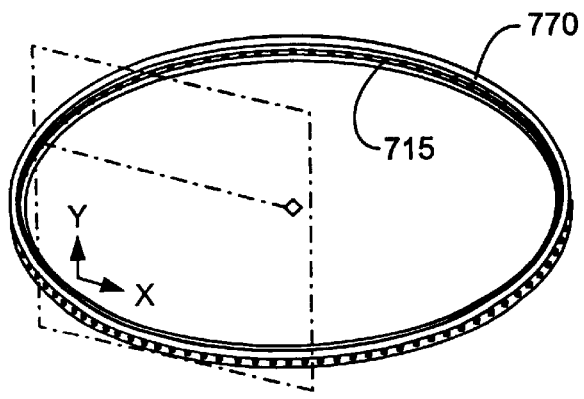

FIGS. 7D–7F are drawings of components of a thermal reservoir sub-assembly for one embodiment. In this embodiment, ring 770, containing a plurality of orifices 715 lays in body 792, which has at least one inlet 701 and outlet 702. Cover 791 is bolted to the body, sealing the subassembly and forming plenum 710. In this embodiment, the form of body surface 793 substantially determines the change in flow channel cross-section area.

It will be readily apparent to those skilled in the art that this invention is not limited to the embodiments described above. Different configurations and embodiments can be developed without departing from the scope of the invention and are intended to be included within the scope of the claims set forth below.

What is claimed is:

1. A method of processing a wafer, comprising:

providing heat to a wafer from at least one thermal source;

smoothing a gradient of at least part of the heat; and removing at least part of the heat with one or more thermal reservoirs;

maintaining a uniform temperature fluid in at least one of the thermal reservoirs by combining at least one non-uniform conduction heat flux and at least one non-uniform convection heat flux.

2. The method of claim 1, wherein maintaining a uniform temperature fluid includes bringing a thermal diffuser in proximity to the at least one of the thermal resources.

3. The method of claim 1, wherein maintaining a uniform temperature fluid further includes varying a cross-section area of at least one of the thermal reservoirs.

4. A method of processing a wafer, comprising:

providing heat to a wafer from at least one thermal source:

smoothing a gradient of at least part of the heat; and removing at least part of the heat with one or more thermal reservoirs;

maintaining a uniform temperature fluid in at least one of the thermal reservoirs by combining at least one non-uniform conduction heat flux and at least one non-uniform convection heat flux, and wherein maintaining a uniform temperature fluid further includes varying at least one flow velocity of fluid in the at least one of the thermal reservoirs.

5. The method of claim 4, wherein the fluid is at least partly accelerated.

6. The method of claim 4, wherein the fluid is at least partly decelerated.

7. The method of claim 4, wherein the fluid includes at least one single-phase liquid.

8. The method of claim 4, the fluid includes at least on gas.

9. A method of processing a wafer, comprising:

providing heat to the wafer from a plurality of independently controlled heating zones of one or more thermal sources;

smoothing a gradient of at least part of the heat in at least a radial direction; and removing at least part of the heat with one or more heat sinks.

10. The method of claim 9, wherein providing heat includes providing a energy flux smoothly varying over at least one of the one or more thermal sources.

11. The method of claim 9, wherein each of the plurality of independently controlled heating zones provides feedback.

12. The method of claim 9, wherein at least one zone of the plurality of independently controlled heating zones includes a plurality of sensors.

13. The method of claim 9, wherein at least one zone of the plurality of independently controlled heating zones include one sensor.

14. A method of processing a wafer, comprising:

providing heat to the wafer from a plurality of independently controlled heating zones of one or more thermal sources;

smoothing a gradient of at least part of the heat in at least a radial direction; and removing at least part of the heat with one or more heat sinks, and wherein a first thermal mass of at least one of the one or more thermal sources is no more than one tenth of a second thermal mass of at least one of the one or more heat sinks.

15. The method of claim 14 wherein said first thermal mass of at least one of the one or more thermal sources is no more than one hundredth of said second thermal mass of at least one of the one or more heat sinks.

16. The method of claim 14, wherein said first thermal mass of at least one of the one or more thermal sources is no more than one thousandth of said second thermal mass of at least one of the one or more heat sinks.

17. The method of claim 14, wherein said first thermal mass of at least one of the one or more thermal sources is no more than ten thousandth of said second thermal mass of at least one of the one or more heat sinks.

* * * * *